United States Patent

[11] 3,614,644

[72] Inventor Daniel Lieberman
Seneca Falls, N.Y.
[21] Appl. No. 884,988
[22] Filed Dec. 15, 1969
[45] Patented Oct. 19, 1971
[73] Assignee Sylvania Electric Products Inc.

[54] AMPLIFIER APPARATUS WITH DISTORTION COMPENSATION
8 Claims, 3 Drawing Figs.

[52] U.S. Cl. .......... 330/28, 330/29, 330/149
[51] Int. Cl. .......... H03f 1/08
[50] Field of Search .......... 330/28, 29, 95, 149; 328/162

[56] References Cited

UNITED STATES PATENTS

| | | | |
|---|---|---|---|
| 2,035,289 | 3/1936 | Bartels .......... | 330/149 |
| 2,583,345 | 1/1952 | Schade .......... | 328/162 X |
| 3,185,887 | 5/1965 | Kobbe .......... | 330/95 X |

*Primary Examiner*—Roy Lake
*Assistant Examiner*—James B. Mullins
*Attorneys*—Norman J. O'Malley, Donald R. Castle and Robert E. Walrath

ABSTRACT: A transistor amplifier is shown wherein a second transistor is connected to generate distortion components substantially the same as those generated by non-linearities of the base-emitter junction of a transistor connected as the amplifier. The distortion components so generated are coupled to the emitter of the amplifier transistor to reduce the distortion due to the base-emitter nonlinearity.

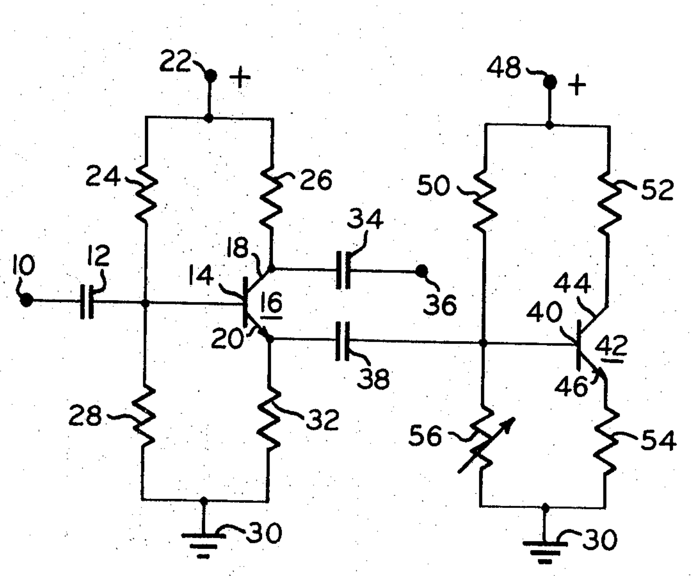
Fig. 1
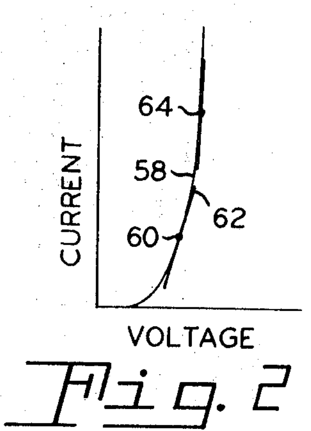
Fig. 2
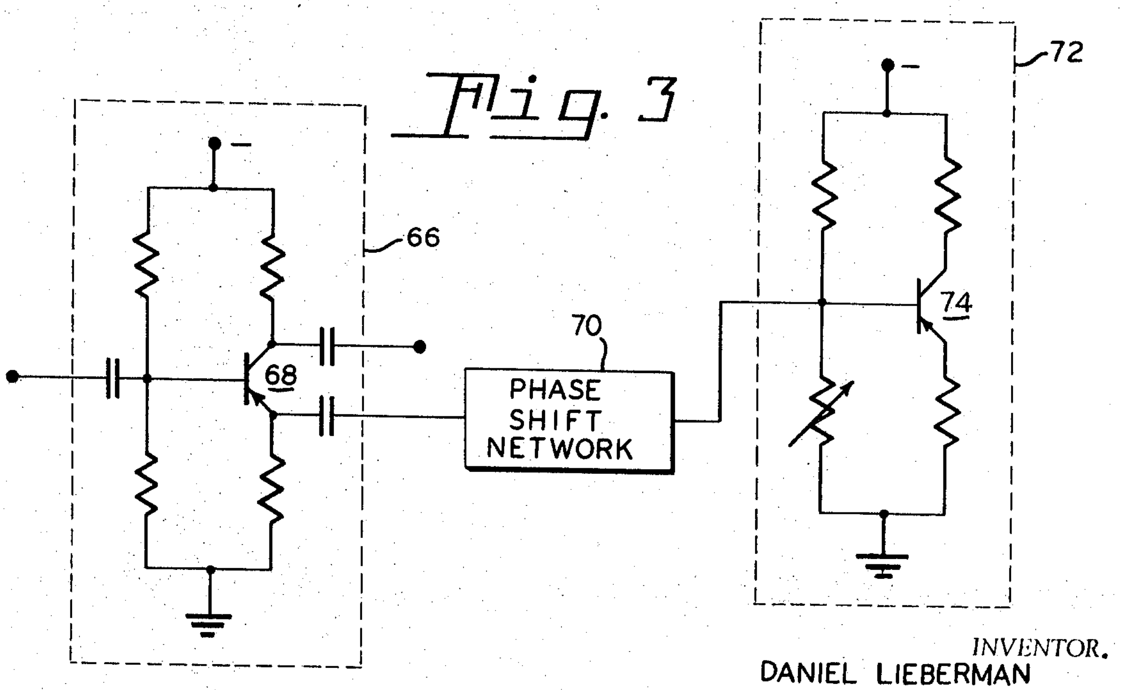
INVENTOR.
DANIEL LIEBERMAN
BY Robert E. Walrath
ATTORNEY

AMPLIFIER APPARATUS WITH DISTORTION COMPENSATION

BACKGROUND OF THE INVENTION

Electronic amplifiers use the nonlinear characteristics of active devices to amplify an input signal. Ordinarily the designer selects a suitable operating point or points on the nonlinear characteristic curves for the active device and designs an amplifier circuit to operate about this point after making the assumption that the active device operates in a linear mode for small signal excursions about the operating point. While this assumption may be satisfactory as a first approximation, the nonlinearity of the active device will distort the input signal.

When the input signal consists of a single sinusoidal frequency, the distorted output signal will be periodic. Therefore, the output signal can be described by a Fourier series where all of the frequency components above the fundamental frequency are harmonic distortion components, that is, the distortion products or components are harmonically related to the fundamental frequency. Amplifiers are commonly used to amplify complex signals including several frequencies not harmonically related. Such signals are ordinarily used in communication systems. Assuming a signal of the form $e_s=E_1\cos W_1t+E_2\cos W_2t$, the distorted output signal from an amplifier may be described by a power series of the form $$e_o=A_o+A_1e_s+A_2e_s^2+A_3e_s^3+\ldots,$$

where the $A_1$'s are proportionality factors dependent upon the circuit designs and parameters. The team $a^o$ can be ignored because it is a constant DC term. The term $A_1e_s$ is the undistorted reproduction of the signal of interest while the higher order terms contain the distortion components or products. The second order term $e_s^2$ includes second harmonics and the sum and difference frequencies of the form $W_1\pm W_2$. The sum and difference frequencies are known as a second order intermodulation because one signal of interest is being modulated by another signal of interest. The third order term $e_s^3$ includes third order harmonics and frequencies of the form $2W_1\pm W_2$ and $2W_2\pm W_1$ known as third order intermodulation. While the third order terms are ordinarily of lower amplitude, the third order intermodulation products are often especially objectionable because they can lie near or within the band of frequencies being amplified, and, therefore, they are amplified by subsequent amplifier stages and they cannot be removed by filtering. Another form of distortion is cross-modulation or crosstalk where modulating components of one carrier wave are impressed on another carrier wave. This type of distortion results from third order nonlinearity in the amplifier.

While there are numerous reasons why a transistor amplifier produces distortion, the most significant reason in most Class A amplifiers of the common emitter configuration is the nonlinearity of the base-emitter junction. The voltage vs. current curve for the base-emitter junction is a typical diode curve or set of curves, that is, an exponential function. The operating point on this curve is determined by the base bias. The usual technique for reducing distortion due to the base-emitter nonlinearity is to increase the base bias so that the operating point is in a more nearly linear region of the curve. This technique has the disadvantages of requiring increased power and of forcing other compromises in amplifier design which can increase the distortion due to other nonlinearities in the transistor.

Another technique for reducing distortion is to use push-pull amplifiers, however, push-pull amplifiers are ineffective for many kinds of distortion and push-pull operation is often undesirable for other reasons. The prior art also discloses other techniques for reducing distortion, e.g., filtering and high feedback levels, however, these other techniques all suffer from a variety of disadvantages and limitations such as high expense, complexity, degraded amplifier performance, and other technical disadvantages.

OBJECTS AND SUMMARY OF THE INVENTION

It is an object of this invention to provide an improved amplifier design.

It is another object of this invention to provide an amplifier wherein distortion is substantially reduced.

It is another object of this invention to provide an amplifier wherein low cost components can be used.

In one aspect of this invention, the above objects and advantages are achieved in a semiconductor amplifier wherein a distortion generator is connected to generate distortion components similar to those caused by the nonlinearity of a junction, such as the base-emitter junction of a transistor, contained in the semiconductor amplifier. The distortion components generated by the distortion generator are coupled to one side of the junction contained in the semiconductor amplifier so as to vary the potential across the junction in the proper phase to compensate for the nonlinearity of the junction.

In a transistor amplifier this invention can be practiced by using a second transistor as the distortion generator with the emitter of the amplifying transistor connected to the base of the distortion generating transistor. The base-emitter junction of the amplifying transistor tends to cause distortions, however, the emitter of the amplifying transistor "sees" the nonlinear base-emitter junction impedance of the distortion generating transistor so that the emitter potential varies in the proper phase relationship to reduce or cancel the distortion due to the nonlinearity of the base-emitter junction of the amplifying transistor.

This invention can be used with less expensive components of poorer quality to achieve a given signal-to-distortion ratio thereby resulting in a less expensive amplifier design. Alternatively, components of a quality equal to those formerly used can be used with this invention to provide an amplifier of substantially improved signal-to-distortion ratio.

BRIEF DESCRIPTION OF THE DRAWINGS

FIG. 1 is a schematic diagram of the preferred embodiment of the invention;

FIG. 2 is a curve showing a voltage-current characteristic of a base-emitter junction of a transistor together with operating points thereon; and FIG. 3 is a schematic diagram of another embodiment of the invention.

DESCRIPTION OF THE PREFERRED EMBODIMENTS

Fir a better understanding of the present invention, together with other and further objects, advantages and capabilities thereof, reference is made to the following disclosure and appended claims in connection with the above-described drawings.

In the preferred embodiment of this invention illustrated in FIG. 1, an input means or terminal 10 is shown connected by means of a capacitor 12 to a control electrode or means or base 14 of an amplifying means or transistor 16. Transistor 16 further has an output electrode or means or collector 18 and a common electrode or means or emitter 20. A source of positive potential illustrated as terminal 22 is connected by means of a resistor 24 to base 14 and by means of a resistor 26 to collector 18. Base 14 is further connected by means of a resistor 28 to a common conductor illustrated as ground 30. Emitter 20 is connected by means of a resistor 32 to ground 30. Collector 18 is connected by means of a capacitor 34 to an output means or terminal 36.

Emitter 20 of transistor 16 is connected by means of a capacitor 38 to a control electrode or means or base 40 of an amplifying means, transistor, or distortion generator 42. Transistor 42 further has an output electrode or means or collector 44 and a common electrode or means or emitter 46. A source of positive potential illustrated as terminal 48 is connected by means of a resistor 50 to base 40 and by means of a resistor 52 to collector 44. Emitter 46 is connected by means of a resistor 54 to ground 30 and base 40 is connected by means of a resistor 56 to ground 30. Resistor 56 is shown as a variable resistor, the function of which will be explained hereinafter.

Transistor 16 is connected as an ordinary amplifier for amplifying alternating signals applied at terminal 10 to provide an amplified replica of the input signal at terminal 36. The magnitudes of resistors 24, 26, 28 and 32 determine the magnitudes of the quiescent base and collector currents through transistor 16.

FIG. 2 illustrates a typical, but simplified, voltage vs. current characteristic curve 58 of the base current of transistor 16. If the biasing resistors are selected such that the quiescent base bias current to transistor 14 is of a value represented by point 60 on curve 58, the input signal applied at terminal 10 will cause the base current to vary along curve 58 about point 60. In designing the amplifier, the designer made a basic assumption that variation of the base current about point 60 was linear or followed a line such as line 62. The deviations of curve 58 from line 62 cause transistor 16 to distort the input signal while amplifying it. If the operating point had been chosen at point 64, which represents a larger quiescent base current, less distortion would be generated by transistor 16 since a line tangent to curve 58 through point 64 is a closer approximation to curve 58 than is line 62. Thus, distortion due to nonlinearities in the base-emitter junction of a transistor can be reduced by increasing the base current. However, it is also noted that increasing the base current may cause other distortion generating mechanism in the transistor to generate larger distortions thereby at least partially defeating the purpose of increasing the base current. Furthermore, increasing the base current requires other design comprises and also requires more power to be supplied by the bias source.

Transistor 42 and its associated bias circuitry comprises a signal generator for generating distortion components substantially the same as those generated by nonlinearities of the base-emitter junction of transistor 16. The signal from emitter 20 of transistor 16 coupled through capacitor 38 to base 40 of transistor 42 is substantially the same as the signal applied at input terminal 10 with a small attenuation.

The effect of the nonlinearity of the base-emitter junction of a transistor is a variation in the dynamic impedance of the base. Accordingly, the dynamic impedance as seen from emitter 20 of transistor 16 varies slightly with the amplitude of the signal applied to the base of transistor 42. This variation in output impedance at emitter 20 of transistor 16 varies the voltage across resistor 32 or the potential of emitter 20 in accordance with the amount of distortion or nonlinearity present in the base-emitter junction of transistor 42. When this variation in potential on emitter 20 is of proper amplitude and phase, it will substantially reduce, compensate, or cancel the distortion due to the nonlinearity of the base-emitter junction of transistor 16. In general, the phase of the variation of the voltage of emitter 20 will be of the proper phase to provide cancellation.

Since it is desired to produce a voltage variation on emitter 20 of transistor 16 which is approximately equal to the voltage variation of base 14 due to the nonlinear impedance of the base-emitter junction of transistor 16, it has been found that preferably transistor 42 is the same type as transistor 16 and preferably 42 is biased at approximately the same operating point as transistor 16. One technique to obtain approximately the same bias point is to bias transistor 42 with a bias circuit substantially identical to the circuit used to bias transistor 16. Resistor 56 shown as a variable resistor to adjust for the best distortion cancellation. Other biasing techniques can also be used provided the distortion components applied to emitter 20 are of the proper phase and amplitude to provide cancellation. This invention is useful for cancelling all of the above-noted types of distortion, however, depending upon the signals being amplified, certain distortion components may be the most undesirable. In such circumstances, the distortion generating transistor 42 can be biased to provide the best cancellation of the most undesirable components. In general, it will be impossible to cancel all distortion components at all frequencies with one particular amplifier design. Generally, the design will be optimized for certain distortion components which are the most undesireable components in that particular design or frequency range.

FIG. 3 illustrates a slightly different embodiment of the invention. An amplifier 66 is designed around a transistor 68. The emitter of transistor 68 is capacitively coupled to a phase shift means or network 70 which is coupled to a distortion generator 72 designed around a transistor 74. Amplifier 66 and distortion generator 72 are similar to those shown in FIG. 1 with PNP transistors substituted for the NPN transistors illustrated in FIG. 1. At some frequencies the distortion cancellation signal applied to the emitter of transistor 68 may be shifted in phase from that appearing on the base, such that the undesired distortion is not correctly phased and, therefore, not reduced as much as desired. In such cases a phase shift network 70 can be used to adjust the phase of the signal so that distortion components are generated by transistor 74 in such a phase relationship that more complete cancellation of the distortion due to the nonlinearity of the base-emitter junction of transistor 68 is obtained. Any conventional phase shift component, device, or circuit may be used as phase shift network 70.

While there have been shown and described what are at present considered the preferred embodiments of the invention, it will be obvious to those skilled in the art that various changes and modification may be made therein without departing from the scope of the invention as defined by the appended claims.

I claim:

1. In an amplifier having at least one semiconductive amplifying means including a transistor means with base, collector, and emitter electrodes, means for reducing distortion due to the nonlinearity of a junction between said base electrode and said emitter electrode comprising:

means for providing a distortion signal including a second transistor means having base, emitter, and collector electrodes; and means connecting said emitter electrode of said first-named transistor means to said base electrode of said second transistor means for coupling the distortion signal to said emitter electrode of said first-named transistor means in a phase and amplitude relationship sufficient to substantially reduce the distortion caused by the nonlinearity of the junction between said base and emitter electrodes of said first-named transistor means.

2. An amplifier as defined in claim 1 wherein said means for providing a distortion signal further includes biasing means for biasing the electrodes of said second transistor means to establish quiescent bias conditions at the electrodes of said second transistor means substantially equal to the quiescent bias conditions at the electrodes of said first-named transistor means.

3. An amplifier as defined in claim 2 wherein said means connecting said emitter electrode of said first-named transistor means to said base electrode of said second transistor means includes a phase shift means for adjusting the phase of the distortion signal.

4. A transistor amplifier including a first transistor means having base means, collector means and emitter means, biasing means for establishing quiescent biasing conditions connected to said first transistor means, and input means connected to said base means to supply an input signal thereto in combination with a second transistor means having base means and emitter means, means for biasing said second transistor means, and means connecting said base means of said second transistor means to said emitter means of said first transistor means for coupling signal distortions due to the nonlinearity of the base-emitter junction of said second transistor means to said emitter means of said first transistor means in a phase and amplitude relationship sufficient to substantially reduce the signal distortion caused by the nonlinearity of the base-emitter junction of said first transistor means.

5. An amplifier as defined in claim 4 wherein said means connecting said base means of said second transistor means to said emitter means of said first transistor means includes a phase shift means for adjusting the phase of the signal distortions supplied to said emitter means of said first transistor means.

6. An amplifier as defined in claim 4 wherein said means for biasing said second transistor means includes a variable component for adjusting the magnitude of the signal distortions due to the nonlinearity of the base-emitter junction of said second transistor means.

7. An amplifier as defined in claim 6 wherein said means for biasing said second transistor means establishes quiescent biasing conditions at the electrodes of said second transistor means substantially equal to the quiescent biasing conditions of said first transistor means.

8. An amplifier as defined in claim 7 wherein said means connecting said base means of said second transistor means to said emitter means of said first transistor means includes a phase shift means for adjusting the phase of the signal distortions supplied to said emitter means of said first transistor means.